US006659168B1

(12) United States Patent
Barsun

(10) Patent No.: US 6,659,168 B1
(45) Date of Patent: Dec. 9, 2003

(54) HEATSINK WITH MULTIPLE FIN TYPES

(75) Inventor: Stephan Barsun, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1 day.

(21) Appl. No.: 10/192,124

(22) Filed: Jul. 9, 2002

(51) Int. Cl.[7] ............................................... H05K 7/20
(52) U.S. Cl. ....................... 165/80.3; 361/704; 361/710
(58) Field of Search ............................. 165/80.3, 185; 361/697, 704, 710; 257/719, 722; 174/16.3

(56) References Cited

U.S. PATENT DOCUMENTS

| | | | | |
|---|---|---|---|---|
| 4,369,838 A | * | 1/1983 | Asanuma et al. ........... | 165/185 |
| 5,930,115 A | * | 7/1999 | Tracy et al. ................ | 361/704 |
| 6,138,352 A | * | 10/2000 | Smith et al. ............. | 29/890.03 |
| 6,239,972 B1 | * | 5/2001 | Tehan et al. ................ | 361/704 |
| 6,377,463 B1 | * | 4/2002 | Shah ........................... | 361/720 |
| 6,408,935 B1 | * | 6/2002 | DeHoff et al. ............. | 165/80.3 |

* cited by examiner

*Primary Examiner*—Allen Flanigan

(57) ABSTRACT

A heat sink includes a base having first and second regions, a first fin of a first type disposed on the first region of the base, and a second fin of a second type disposed on the second region of the base. The first and second regions of the base may be integral with or attached to one another. Such a heat sink can dissipate heat from multiple electronic components with the respective fin type that is most cost effective for each respective component. Using such a heat sink often reduces manufacturing time and costs as compared to using a separate heat sink for each component. In addition, such a heat sink can dissipate heat from multiple regions of a single electronic component with the respective fin type that is most cost effective for each region.

12 Claims, 3 Drawing Sheets

HEATSINK WITH MULTIPLE FIN TYPES

BACKGROUND OF THE INVENTION

It is well known that electronic components generate heat as a result of the electronic functions that the electronic components are designed to accomplish. As the generated heat increases above respective critical temperatures, failures can occur in the operation of these electronic components and, therefore, the excess heat must be dissipated to insure continued operation of these electronic components.

In the past, heat has been dissipated by a respective heat sink attached directly to each electronic component. Typically, a heat sink is made of a substance optimal for conducting heat and maintaining the temperature of the electronic component at a safe level by dissipating the heat generated by the component into an ambient environment such as air.

Generally, the respective heat sink that can provide the required heat dissipation at the lowest cost is used for each electronic component. As heat sinks have become a common means of maintaining safe operating temperatures in electronic components, different configurations of heat sinks have been developed that have different costs and heat-dissipation capabilities. In essence, by increasing the surface region exposed to the ambient environment, a heat sink can dissipate heat at a faster rate. Larger-area heat-sink configurations, however, have often proved to be more costly to manufacture because of more intricate shapes and designs. Generally speaking, as the rate of heat dissipation increases for a given heat sink, the cost of manufacturing the heat sink increases as well.

Unfortunately, as circuit boards become more densely populated with electronic components, the cost and difficulty of installing individual heat sinks for each electronic component becomes increasingly troublesome and costly.

Moreover, using a single heat sink for a large electronic component having regions with different heat-dissipation requirements can be costly because the heat sink typically includes the type of fin required by the highest heat-generating region.

SUMMARY OF THE INVENTION

According to an embodiment of the invention, a heat sink includes a base having first and second regions, a first fin of a first type disposed on the first region of the base, and a second fin of a second type disposed on the second region of the base. The first and second regions of the base may be integral with or attached to one another.

Such a heat sink can dissipate heat from multiple electronic components with the respective fin type that is most cost effective for each respective component. Using such a heat sink often reduces manufacturing time and costs as compared to using a separate heat sink for each component.

In addition, such a heat sink can dissipate heat from multiple regions of a single electronic component with the respective fin type that is most cost effective for each region.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
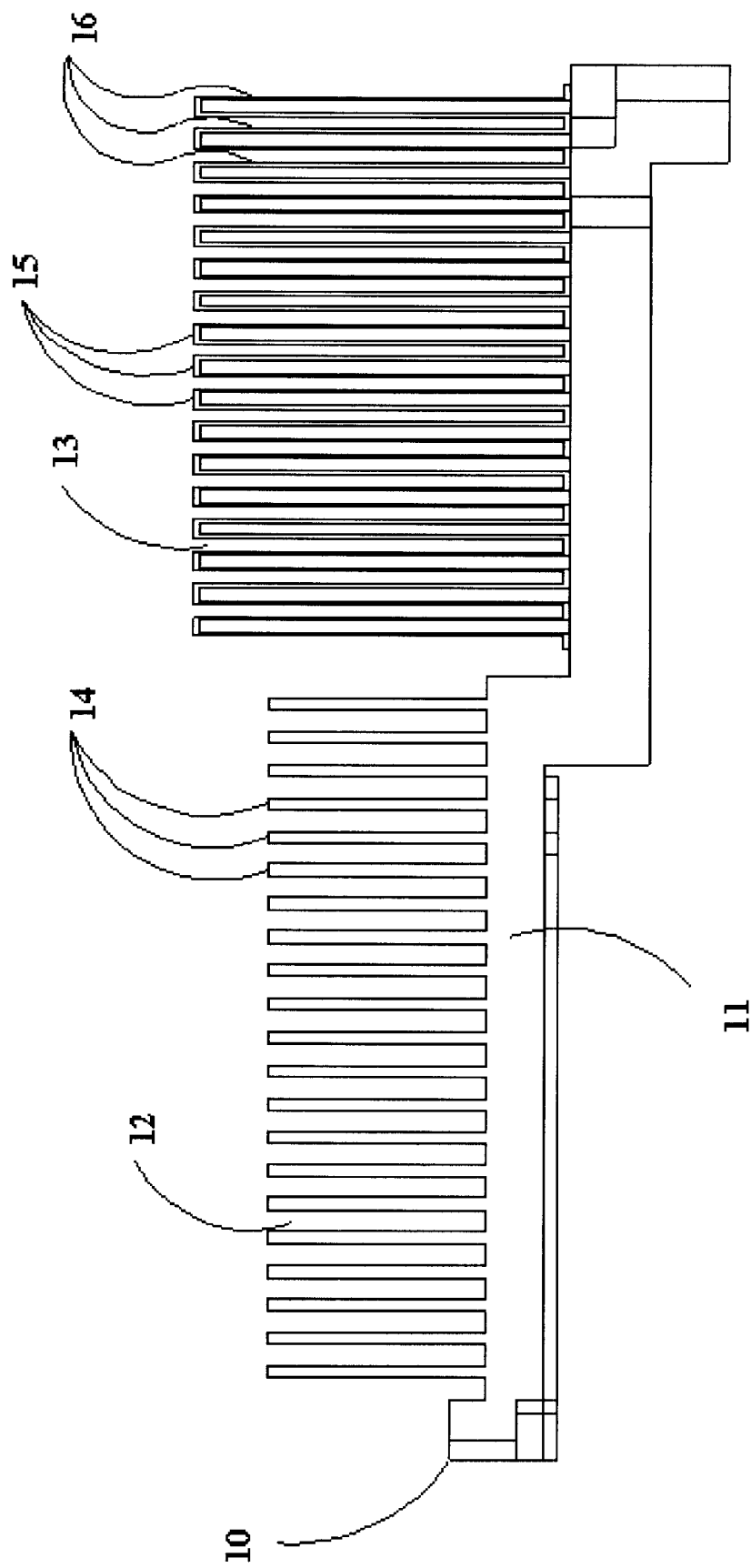
FIG. 1 is a side view of a heat sink having multiple fin configurations in accordance with one embodiment of the invention.
Figure 2:
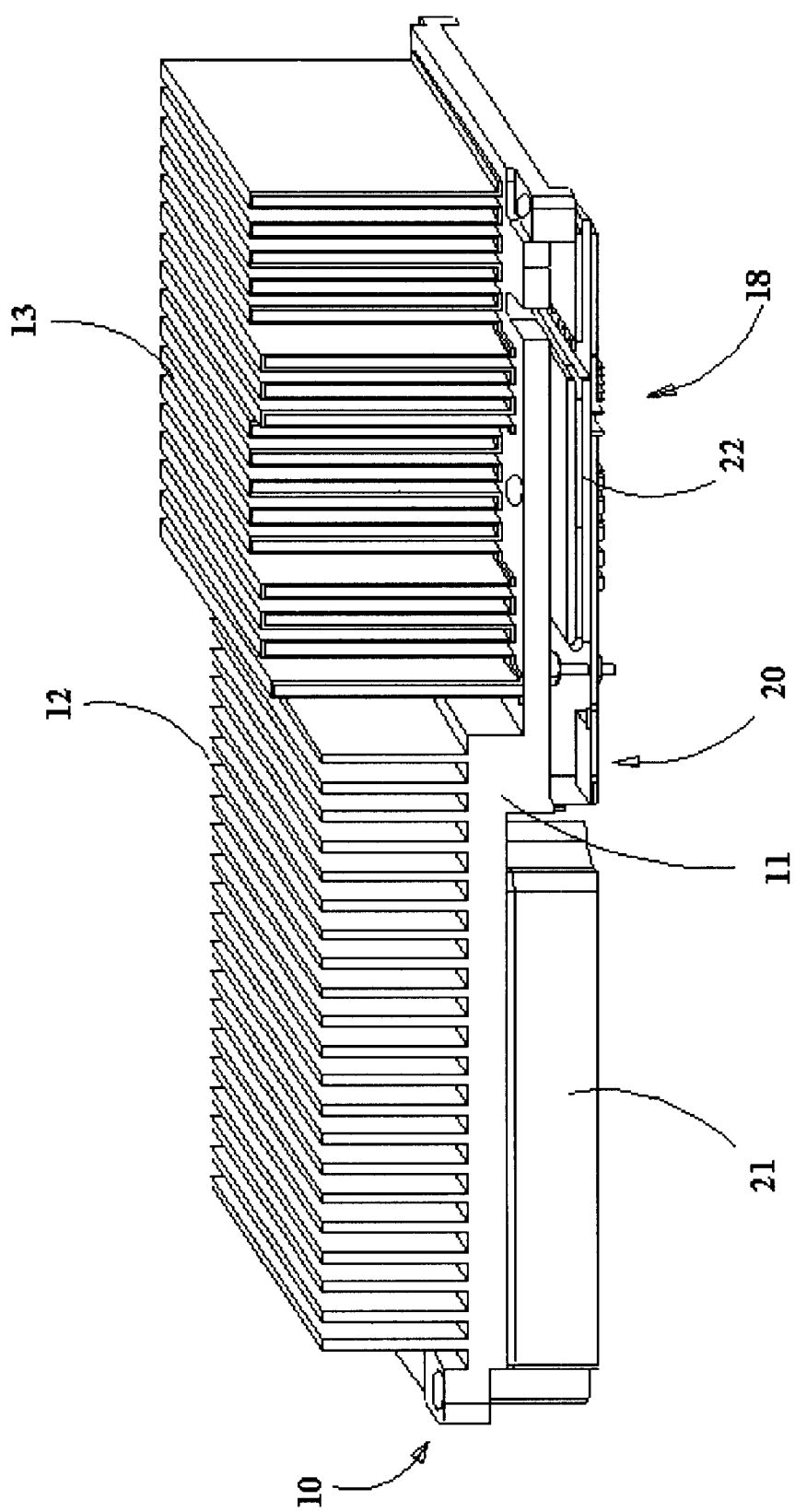
FIG. 2 is an isometric view of circuit-board assembly that includes the heat sink of FIG. 1 in accordance with one embodiment of the invention.

FIG. 1 shows a heat sink 10 according to an embodiment of the invention. The heat sink 10 has a common integral base 11, although the base may not be integral, i.e. it may include two or more base pieces (not shown) attached together to form the base 11. The base 11 is of any shape suitable to be attached to a heat generating device, such as for example, an electronic component mounted to a printed circuit board (FIG. 2). Where the base 11 is integral, it is formed as a continuous body of material that has a high propensity for conducting heat. For example, the base 11 can be formed from materials such as aluminum, copper, and/or other metal alloys, plastic and/or epoxy, or any other suitable heat conducting material. In one embodiment, the base 11 is formed from a continuous piece of aluminum alloy and its bottom is shaped to fit the contour of one or more electronic components (FIG. 2) a printed circuit board. In another embodiment where the base 12 is not integral, the base may be formed from two different materials, such as for example, aluminum in a first region and copper in a second region. The two base regions, regardless of whether they are formed from the same or different materials, are attached together by a conventional means such as bolting, harnessing, adhesive, or welding.

The heat sink 10 also includes multiple configurations of fins that are attached to the base 11 and are intended increase the heat sink's 10 surface area in order to increase ambient air contact, and thus, heat dissipation. By increasing the ambient air contact, heat is dissipated from the electronic component through the heat sink 10 and to the ambient air at a faster rate.

The heat sink 10 can include two or more of several different fin configurations such as those described below. FIG. 1 shows the heat sink 10 with two different fin configurations in two different regions of the heat sink 10. The heat sink 10 is shown having a first region on the left with a first fin configuration 12. The first fin configuration 12 is shown as an extruded fin configuration; however, the first fin configuration 12 can be any other fin configuration. The heat sink 10 has a second region on the right with a second fin configuration 13. The second fin configuration 16 is shown as a folded fin configuration; however, again, any other fin configuration that is different than the first fin configuration 14 can be used. Extruded, folded, and other types of fin configurations are discussed in more detail below.

Other embodiments of the heat sink 10 are contemplated. For example, the heat sink 10 may include more than two regions and more than two fin configurations. These regions may include their own base pieces or the heat sink 10 may include an integral base. Also, the heat sink 10 may be used with a single electronic component having regions with different heat-dissipation characteristics. In such an embodiment, the regions of the heat sink 10 would typically be disposed over the respective regions of the component.

Still referring to FIG. 1, there are several different fin configurations that can be used in accordance with the present invention. The extruded fin configuration 12 on the left of the heat sink 10 is a common fin configuration that is inexpensive and often used when the rate of heat dissipation is not as vital. The extruded fin configuration is characterized by several fins 14 emanating from the base 11. The region of the base 11 beneath the extruded fin configuration 12 is in thermal contact with an electronic component, or region thereof, from which heat is to be dissipated. Extruded fins are typically formed in one of two ways. The first way is to mold the fins and the base together using a molten substance, such as for example, molten aluminum, such that when the molten substance hardens, the fins and base are formed integral to one another. The second common way of forming extruded fins is to begin with a solid block of a particular substance and then use a machining tool to cut out the fins.

The folded-fin configuration 14 one the right side of the heat sink 10 is typically more expensive than the extruded fin configuration 12 but provides a higher rate of heat dissipation. One typically forms folded-fin protrusions 15 by folding a piece of sheet metal in accordion-like fashion. The protrusions 15 have sides 16, which are typically called the "fins," although the protrusions themselves may be called the "fins." The bottoms of the protrusions 15 are attached to the base 11 in a conventional manner that allows heat to conduct from the base to the protrusions. Because the protrusions 14 are formed separately from and then attached to the base 11, folded fins are typically more expensive than extruded fins. But because the sides 16 are thinner than the extruded fins 14, folded fins typically provide more heat dissipation per unit volume than extruded fins provide.

FIG. 2 is a perspective view of a circuit-board assembly 18 that incorporates the heat sink 10 of FIG. 1 according to an embodiment of the invention. The heat sink 10 is attached to a printed circuit board 20 that contains electronic components that generate heat. Specifically, the printed circuit board 20 has a first electronic component 21 and a second electronic component 22 mounted thereto. The first component 21 runs cool enough such that an extruded-fin configuration provides adequate cooling, but the component 22 runs hotter such that a folded-fin configuration is needed for adequate cooling. Therefore, the base 11 of the heat sink 10 is formed to fit the contour of the printed circuit board 20 and the first and second electronic components 21 and 22 such that the first component is in direct contact with the first region of the heat sink 10 having the first fin configuration 12 and the second component is in direct contact with the second region of the heat sink having the second fin configuration 13.

By forming extruded- and folded-fin configurations in the first and second regions of the heat sink 10, the heat sink need not have the more expensive folded-fin configuration in regions where the cheaper extruded-fin configuration will suffice. Therefore, the overall cost of a heat sink 10 is typically reduced because the more expensive fin configurations are only used in the regions of the heat sink 10 where they are needed.

Still referring to FIG. 2, although described as having one fin configuration per electronic component, the heat sink 10 may include multiple fin configurations for a single component. For example, both the fin configurations 12 and 13 may be disposed over a single electronic component that generates different amounts of heat in different regions. Alternatively, there may be multiple electronic components beneath one fin configuration.

Figure 3:
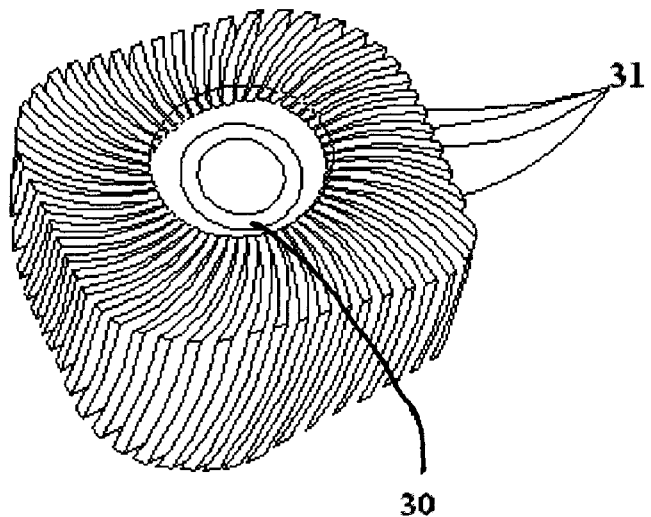
FIG. 3 is a perspective view of a skived fin configuration that the heat sink of FIG. 1 can incorporate according to an embodiment of the invention.

FIG. 3 is a perspective view of a heat sink 10 having a skived fin configuration, which is another fin configuration that the multi-fin-configuration heat sink 10 of FIGS. 1 and 2 may incorporate. The skived-fin configuration is characterized by several fins 31 emanating from a base 30. The base 30 is in thermal contact with the region of an electronic component that heat is to be dissipated from when used as a heat sink. A skived-fin configuration is similar to an extruded-fin configuration but differs in the way in which the fins are created. Generally, the skived fins are created by planning the base 30 in a controlled manner such that each planed shaving becomes one of the fins 31. The skived-fin and extruded-fin configurations typically have similar heat-dissipation properties, but the skived-fin configuration is often cheaper to manufacture.

Other fin configurations such as a swaged-fin configuration (not shown) and variations of these fin configurations and those described herein can also be used in accordance with other embodiments of the invention.

Figure 4:
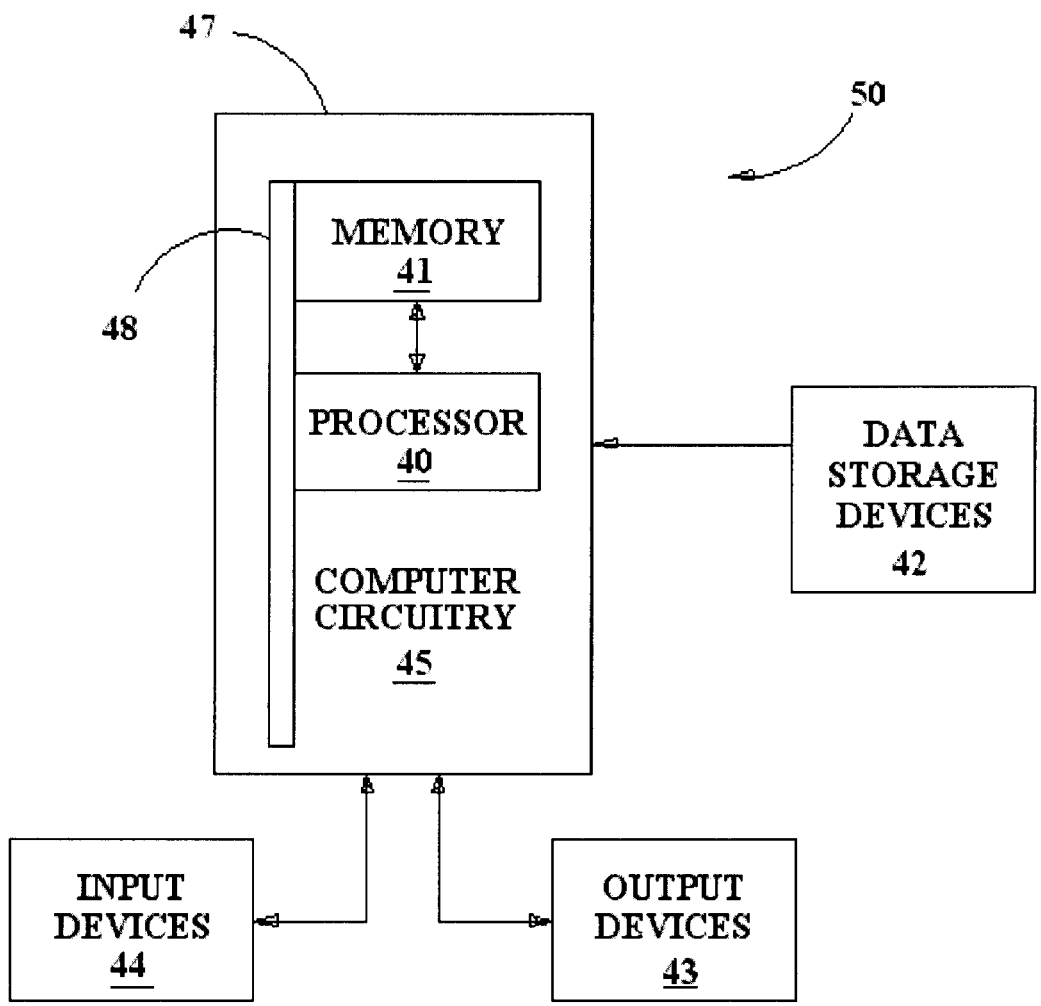
FIG. 4 is a block diagram of an electronic system that incorporates the circuit-board assembly of FIG. 2 according to an embodiment of the invention.

FIG. 4 is a block diagram of a computer system 50 that incorporates one or more circuit-board assemblies 18 of FIG. 2 according to an embodiment of the invention. The system 50 includes computer circuitry 45, which is typically composed of one or more circuit-board assemblies 18 that are mounted within an enclosure 47. One or more of the assemblies 18 typically include a processor unit 40 and a memory 41. Coupled to the circuitry 45 are one or more data-storage devices 43 such as a disk drive, one or more input devices 44 such as a keyboard, and one or more output devices 43 such as a display. Typically, a heat sink 48 is attached to circuitry 45, the processor unit 40 and the memory 41 such that heat is dissipated more efficiently than heat sinks for each of these components.

While embodiments of the invention have been illustrated and described, it will be appreciated that various changes can be made therein without departing from the spirit and scope of the invention.

What is claimed is:

1. A heat sink, comprising:
   a base having first and second regions;
   a first fin joined to the first region of the base in a first manner;
   a second fin joined to the second region of the base in a second manner;
   wherein the first region of the base comprises a first base piece; and
   wherein the second region of the base comprises a second base piece that is attached to the first base piece.

2. A heat sink, comprising:
   a base having first and second regions;
   a first fin joined to the first region of the base in a first manner;
   a second fin joined to the second region of the base in a second manner;
   wherein one of the first and second fins comprises a folded fin that is attached to the respective region of the base with an attaching agent.

3. A heat sink, comprising:
   a base having first and second regions;
   a first fin joined to the first region of the base in a first manner;
   a second fin joined to the second region of the base in a second manner; and
   wherein one of the first and second fins comprises a skived fin that is integral with the respective region of the base.

4. A heat sink, comprising:
a first region having a first set of fins joined to the first region in a first manner to provide a predetermined first rate of heat dissipation;
a second region having a second set of fins joined to the second region in a second manner to provide a predetermined second rate of heat dissipation;
a first base; and
a second base attached to the first base, wherein the first region is attached to or integral with the first base, and wherein the second region is attached to or integral with the second base.

5. A circuit-board assembly, comprising:
a circuit board;
first and second electronic components mounted to the circuit board; and
a heat sink disposed on the electronic components and comprising:
  a base having a first region disposed on the first component and having a second region disposed on the second component;
  a first set of fins joined to the first region of the base in a first manner; and
  a second set of fins joined to the second region of the base in a second manner.

6. The circuit-board assembly of claim 5, wherein the first electronic component generates heat at a different rate than the second electronic component.

7. The circuit-board assembly of claim 5, wherein the first set of fins has a different amount of surface area than the second set of fins.

8. The circuit-board assembly of claim 5 wherein:
the first electronic component is in thermal contact with the first region of the base;
and the second electronic component is in thermal contact with the second region of the base.

9. An electronic system, comprising:
an enclosure; and
a circuit-board assembly disposed in the enclosure, the assembly comprising,
  a circuit board,
  first and second electronic components mounted to the circuit board, and
  a heat sink disposed on the electronic components and comprising,
    a base having a first region disposed on the first component and having a second region disposed on the second component,
    a first set of fins joined to the first region of the base in a first manner, and
    a second set of fins joined to the second region of the base in a second manner.

10. A method, comprising:
dissipating heat through a first region of a heat sink having a common base, the first region including a first fin joined to the common base in a first manner;
dissipating heat through a second region of the heat sink, the second region including a second fin joined to the common base in a second manner; and
wherein dissipating heat through the first and second regions of the heat sink comprise dissipating the heat generated by a single electronic component on which the heat sink is disposed.

11. A method, comprising:
dissipating heat through a first region of a heat sink having a common base, the first region including a first fin joined to the common base in a first manner;
dissipating heat through a second region of the heat sink, the second region including a second fin joined to the common base in a second manner;
wherein dissipating heat through the first region of the heat sink comprises dissipating the heat generated by a first electronic component on which the first region is disposed; and
wherein dissipating heat through the second region of the heat sink comprises dissipating the heat generated by a second electronic component on which the second region is disposed.

12. A method of manufacturing a heat sink, the method comprising:
forming a first fin in a first region of the heat sink in a first manner;
forming a second fin in a second region of the heat sink in a second manner; and
forming the first region integral with the second region.

* * * * *